United States Patent [19]

Potash et al.

[11] Patent Number: 4,933,735
[45] Date of Patent: * Jun. 12, 1990

[54] DIGITAL COMPUTER HAVING CONTROL AND ARITHMETIC SECTIONS STACKED ABOVE SEMICONDUCTOR SUBSTRATE

[75] Inventors: Hanan Potash, La Jolla; Burton L. Levin; Bruce B. Roesner, both of San Diego, all of Calif.

[73] Assignee: Unisys Corporation, Blue Bell, Pa.

[*] Notice: The portion of the term of this patent subsequent to Apr. 10, 2001 has been disclaimed.

[21] Appl. No.: 634,199

[22] Filed: Jul. 27, 1984

Related U.S. Application Data

[63] Continuation of Ser. No. 237,427, Feb. 23, 1981, abandoned.

[51] Int. Cl.$^5$ .................. H01L 27/112; G11C 11/36
[52] U.S. Cl. ........................ 357/45; 357/15; 357/59; 365/104
[58] Field of Search ............... 357/15, 45, 59; 365/104

[56] References Cited

U.S. PATENT DOCUMENTS

| | | | |
|---|---|---|---|
| 3,699,543 | 10/1972 | Neak | 357/2 |
| 3,987,418 | 10/1976 | Buchanan | 357/59 |
| 4,070,654 | 1/1978 | Tachi | 357/15 |
| 4,146,902 | 3/1979 | Tanimoto et al. | 357/6 |
| 4,149,302 | 4/1979 | Cook | 357/51 |
| 4,203,123 | 5/1980 | Shanks | 357/2 |
| 4,442,507 | 3/1985 | Roesner | 357/45 |

*Primary Examiner*—William D. Larkins
*Attorney, Agent, or Firm*—Charles J. Fassbender; Robert S. Bramson

[57] ABSTRACT

Disclosed is a digital computer having memory means stacked on an insulating layer over a semiconductor substrate. In one embodiment, the memory means includes an array of diodes which overflies the substrate and generates control signals for an arithmetic section that lies in the substrate; and in another embodiment, the memory means includes N arrays of diodes which overlie the substrate and operate in parallel to generate signals representing arithmetic transformation of a portion of their address inputs.

11 Claims, 7 Drawing Sheets

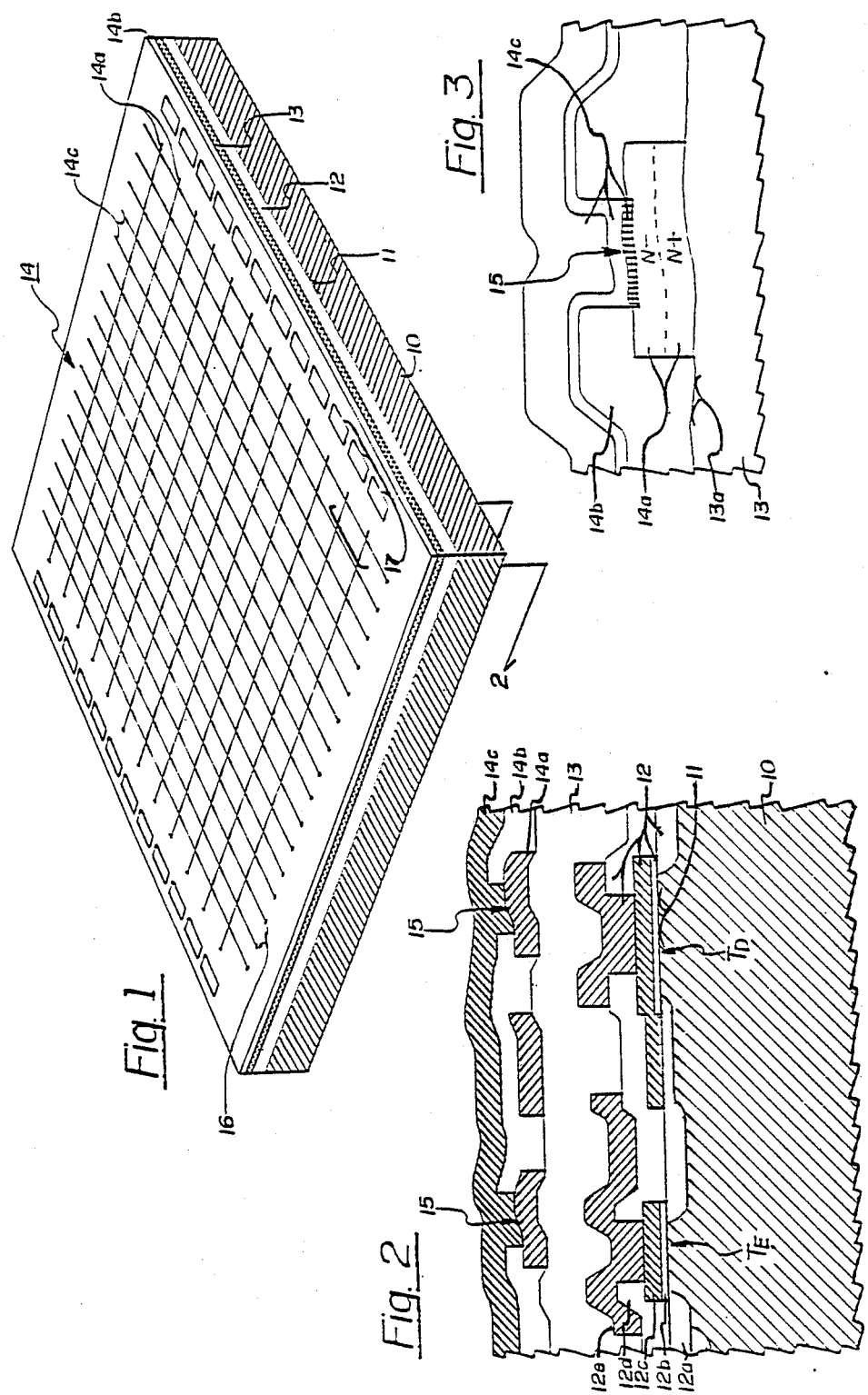

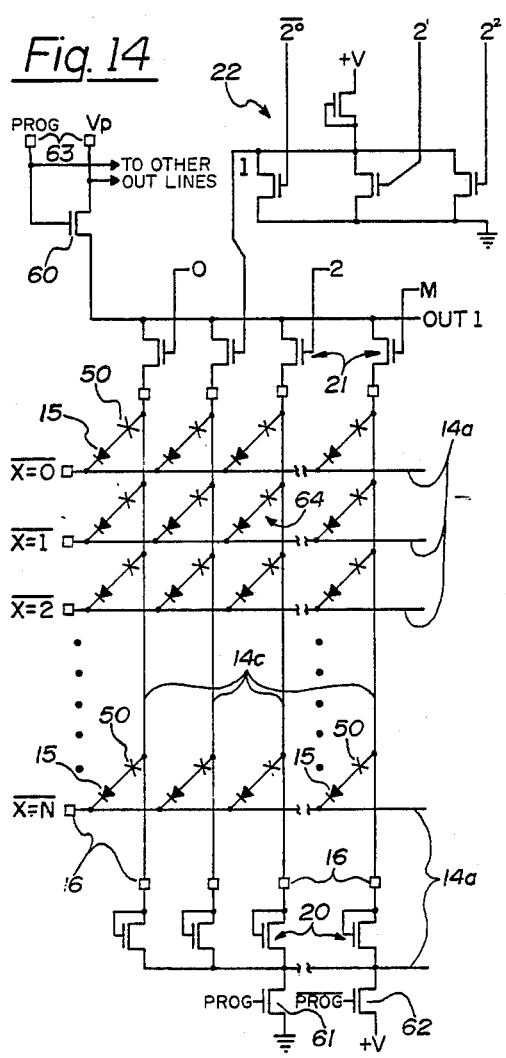
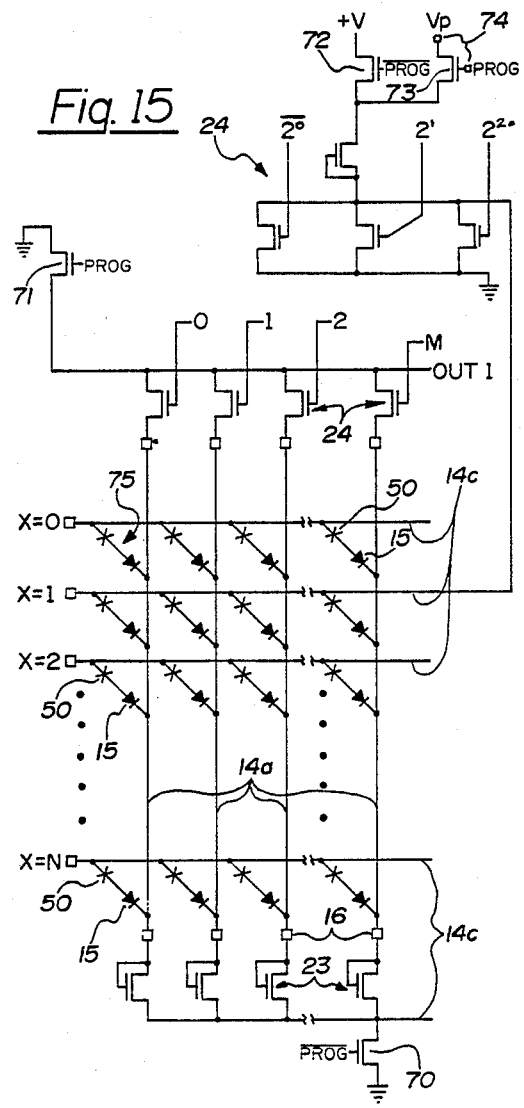
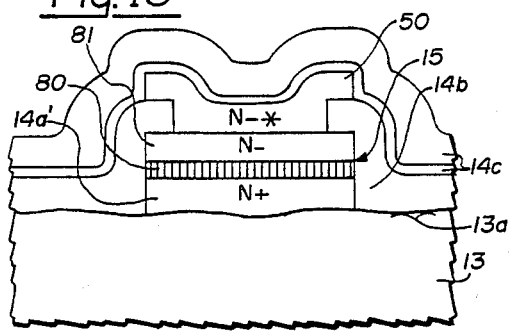
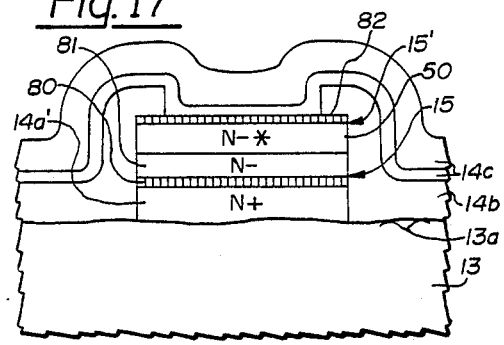

DIGITAL COMPUTER HAVING CONTROL AND ARITHMETIC SECTIONS STACKED ABOVE SEMICONDUCTOR SUBSTRATE

This is a continuation of application Ser. No. 237,427, filed Feb. 23, 1981, now abandoned.

BACKGROUND OF THE INVENTION

This invention relates to the architecture of digital memories and digital computers as integrated on a single substrate—such as a semiconductor chip or wafer.

A continual problem in this field which the integrated circuits (IC) industry faces year after year is how to integrate more and more circuitry onto the substrate. Each year, millions of dollars in research are spent by the industry on this problem. And as a result, digital memories have advanced over the years from 64 bits/chip to 65,000 bits/chip; and digital computers—the smallest of which was once comprised of thousands of chips—are now packaged on a single chip.

Two techniques have been utilized to achieve this advancement in the art. They are making the area of the chips larger, and making the individual circuit components (e.g. transistors) smaller. Over the last ten years, for example, chip areas have increased from $150 \times 150$ mils$^2$ to $300 \times 300$ mils$^2$; and FET transistor channel lengths have decreased from 8 um to less than 2 um.

Presently, the IC industry is spending additional millions of dollars on research to further increase the amount of circuitry on a chip by further increasing chip size. But as chip size is increased, yield rapidly decreases in a nonlinear fashion. For example, a process with $200 \times 200$ mils$^2$ chips having a 20% yield could be expected to have a yield of near 0% on chips of $400 \times 400$ mils$^2$.

This is because non-defective chips occur randomly in a wafer. Thus, doubling the sides of a $200 \times 200$ mil$^2$ chip in a particular process is equivalent to accepting only sets of four non-defective $200 \times 200$ mils$^2$ chips that occur side by side. But since the defect-free $200 \times 200$ mils$^2$ chips occur at random, the probability of having four of them occur side by side is near 0%.

To overcome this problem, the IC industry traditionally attempts to reduce the source of the defects. But this is a very complex and expensive approach because there are so many different defect sources. Also, the techniques for further reducing various particular defect sources are already being pushed to their limits.

For example, the typical number of crystalline defects in a substrate has already been reduced over the last ten years from 1,000 defects/cm$^2$ to 50/cm$^2$. Also, impurity concentrations for various chemicals have been refined to 99.999%. Foreign particles in clean rooms have been reduced from 1,000 particles of less than 3 um diameter per ft$^3$ to 100 particles of less than 1 um diameter per ft$^3$. Processing temperatures have been lowered from over 1,000° C. to less than 900° C. to reduce stress-induced defects. And projection aligners have been developed to replace contact printing to reduce mask-induced defects.

Similarly, the IC industry is also spending millions of dollars each year on reducing the size of individual circuit components. But these efforts are also frustrated by multiple limitations. For example, electron-beam lithography or x-ray lithography is required to fabricate components having geometries of less than about 2 um. But these techniques are very expensive and are still in the experimental stage. Compensating for electron scattering and proximity effects still needs further work, for example.

Also, undercutting during any etching process is a major problem. This is because since lateral dimensions are small to begin with, the slightest undercutting will aggravate any narrow width electronic phenomena—such as bird-beak for example. And this in turn can render the device inoperable.

Further, reducing the area of circuit components also requires that they be scaled in the vertical direction. Junction depths, for example, need to be shrunk. But this further limits the processing temperatures—otherwise the junction depths will increase through diffusion.

Another problem which the IC industry also spends millions of dollars on each year is how to increase the operating speed of the circuits on the chips. Again, many factors limit this speed of operation. But they include, for example, the existence of parasitic capacitances between the circuit components and the substrate, and high resistivities of various doped regions in the substrate. These limitations are developed herein in greater detail in the Detailed Description.

Still another problem that is particularly associated with mask-programmable read-only memories and digital computers incorporating the same is how to reduce the time that is required to fill a particular customer's order. This is a problem because since the chips are mask-programmable, their fabrication process varies for each customer. Thus, the chips cannot be fabricated until an order is received; and also, the fabrication process becomes longer as chip areas get larger and circuit components get smaller.

Therefore, the primary object of this invention is to provide an improved architecture for digital memories and digital computers as integrated on a single semiconductor substrate which avoids all of the above problems.

BRIEF SUMMARY OF THE INVENTION

These and other objectives are accomplished in accordance with the invention by digital computers having vertically stacked control sections and arithmetic sections. One embodiment includes register means in a substrate for storing operands; arithmetic means in the substrate for performing arithmetic operations on the operands in response to control signals; an insulating layer over the register means and arithmetic means; and an array of diodes on the insulating layer having outputs coupled therethrough to the arithmetic means for storing the control signals. Another embodiment includes register means in a substrate for storing operands and control signals; an insulating layer over the register means; and N arrays of diodes on top of the insulating layer which generate signals representing arithmetic transformations of the operands as specified by control signals.

BRIEF DESCRIPTION OF THE DRAWINGS

Various features and advantages of the invention will best be understood with reference to the following detailed description and the accompanying drawings wherein:

FIG. 1 is a pictorial view of a memory which comprises one embodiment of the invention.

FIG. 2 is a greatly enlarged cross-sectional view of a portion of the FIG. 1 memory.

FIG. 3 illustrates a preferred structure for the plurality of selectable electrical contacts in the memory of FIGS. 1 and 2.

FIG. 14 is a detailed circuit diagram of the FIG. 11 embodiment and a preferred addressing means.

FIG. 15 is a detailed circuit diagram of the FIG. 11 embodiment and another preferred addressing means.

FIG. 16 is a greatly enlarged cross-sectional view of still another embodiment of the invention.

FIG. 17 is a greatly enlarged cross-sectional view of still another embodiment of the invention.

DETAILED DESCRIPTION OF THE INVENTION

Figure 5:
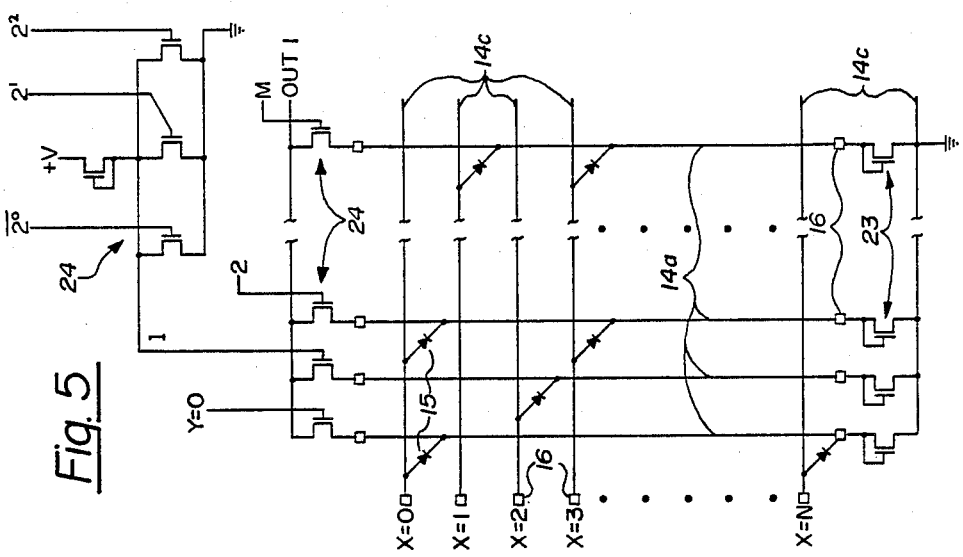
FIG. 5 is a detailed circuit diagram of the memory of FIGS. 1-3 with another preferred addressing means.

Referring now to FIG. 1, the details of one preferred embodiment of the invention will be described. This embodiment includes a semiconductor substrate 10 having a surface 11 on which a plurality of interconnected field effect transistors are fabricated. These field effect transistors and their interconnections are indicated in general in FIG. 1 by reference numeral 12; and they are also indicated in greater detail in FIG. 2.

Overlying this plurality of interconnected transistors is an insulating layer 13; and on top of layer 13 is a read-only memory 14. Memory 14 is comprised of components 14a, 14b, 14c, and 15. Component 14a is a plurality of spaced-apart semiconductor lines which lie directly on insulating layer 13. Component 14b is an insulating layer which covers lines 14a. And component 14c is a plurality of spaced-apart metal lines which lie on insulating layer 14b. These semiconductor lines and metal lines serve as select lines for the cells in memory 14.

To program memory 14, a plurality of Schottky diodes 15 are selectively made between lines 14a and 14c. These diodes are indicated in FIGS. 2 and 3. Each diode is formed by a contact between lines 14a and 14c; and the presence or absence of a diode indicates the information which is stored in the memory.

In other words, each crossing of one semiconductor line 14a and one metal line 14c forms one cell of memory 14. And the information in that cell is programmed by forming a selectable contact (i.e., forming a selectable Schottky diode) at the crossing. Then, depending upon whether positive or negative logic is used, the presence of a contact indicates either a logical 1 or a logical 0 while the absence of a contact indicates just the opposite.

Information is read from memory 14 by selectively addressing the memory cells. A decoder for these addresses is formed by the plurality of interconnected transistors 12. They include both depletion mode transistors $T_D$ and enhancement mode transistors $T_E$ as illustrated in FIG. 2. Reference numerals 12a, 12b, 12c, 12d, and 12e respectively indicate the source-drain, gate oxide, polysilicon gate, insulating layer between polysilicon and metal, and metal interconnects for these transistors.

Interconnections between these transistors and memory 14 are made through a plurality of apertures 16 which penetrate insulating layer 13. In the illustrated preferred embodiment of FIG. 1, the apertures 16 extend around the perimeter of substrate 10. This leaves the interior portion of substrate 10 open for other logic—that is, logic in addition to the memory address decoder—which is also formed by the interconnected transistors 12.

A plurality of metal bonding pads 17 also lie over the perimeter of substrate 10. They are used as I/O pins for sending external signals to and receiving signals from memory 14 and the other additional logic. Preferably, memory 14 together with this additional logic form a densely packaged digital computer, as will be described shortly in conjunction with FIGS. 6-10.

Turning now to FIG. 3, a preferred structure for each cell in memory 14 is illustrated in greater detail. In this structure, insulating layer 13 is comprised of Si O$_2$ and is 7,000 Å-10,000 Å thick. This relatively large thickness is preferred because it tends to smooth out surface 13a on which memory 14 is fabricated; and also, any capacitances between memory 14 and the underlying interconnected plurality of transistors 12 are essentially eliminated.

Each of the spaced-apart semiconductor lines 14a in the FIG. 3 structure is formed by a polycrystalline layer of N$^-$ semiconductor material in direct contact with a polycrystalline layer of N$^+$ semiconductor material. The impurity concentration of the N$^{31}$ layer is $10^{14}$-$10^{17}$ dopant atoms/cm$^3$; and the impurity concentration of the N$^+$ layer is anything greater than $10^{20}$ atoms/cm$^3$. These N$^-$ and N$^+$ layers suitably are each 4,000 Å thick.

Preferably, these N$^-$ and N$^+$ layers are fabricated by depositing either silicon or germanium which is doped in situ as deposited on surface 13a. Arsenic, phosphorous, and antimony are suitable dopant impurity atoms. These N$^-$ and N$^+$ layers are annealed at temperatures above 600° C. to activate the dopant atoms. That is, the annealing causes the dopant atoms to take substitutional positions in the silicon/germanium polycrystalline lattice network.

Each of the spaced-apart metal lines 14c also preferably has a multilayered structure. The bottom layer, that is the layer closest to semiconductor lines 14a, is comprised of a noble metal—such as platinum for example. Suitably, this layer is 250 Å thick. After the noble metal is deposited, it is heated to 600° C. to form a compound (e.g., platinum silicide) with the underlying N$^-$ semiconductor layer, as indicated by the vertical crosshatch lines in FIG. 3.

That portion of the noble metal which lies on insulating layer 14b does not form a compound; and instead it is subsequently removed. Then a barrier metal, such as titanium tungsten, is deposited in its place. Suitably, the thickness of this barrier metal is 1,000 Å. Thereafter, a conductive metal, such as aluminum, is deposited on the titanium tungsten. Suitably, the thickness of this conductive metal is 8,000 Å.

With this structure, the conductive metal operates to minimize the resistance of the lines 14a. The barrier metal operates to prevent the conductive metal from diffusing through the semiconductor lines 14a. And the junction between the silicide of the noble metal and the underlying $N^-$ layer forms the Schottky diode 15.

Through experimental testing, Schottky diodes 15 formed by the above structure have been found to have a turn-on voltage of $0.41 \pm 0.02$ volts, a leakage current of $15 \times 10^{-9}$ amps, and a reverse breakdown voltage of 10 volts. Also, the resistance of the semiconductor lines 14a and the metal lines 14c have been found to be 15 ohms per square and 0.04 ohms per square respectively. An even lower resistivity of the semiconductor lines 14a may be achieved, as an alternative, by adding a layer of molybdenum silicide between the $N^+$ semiconductor layer and the insulating surface 13a.

Figure 4:
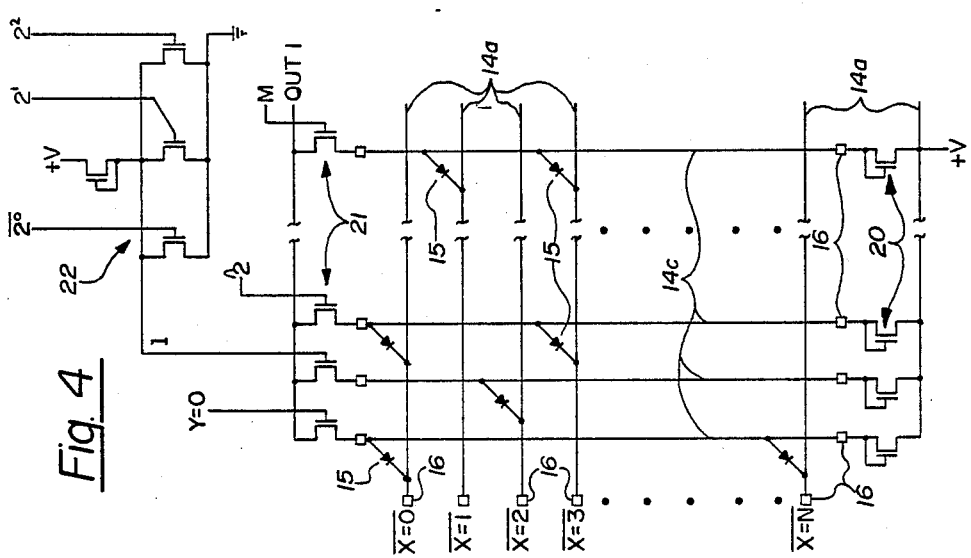
FIG. 4 is a detailed circuit diagram of the memory of FIGS. 1-3 with one preferred addressing means.

Turning now to FIG. 4, one preferred means for reading information from memory 14 will be described. In that Figure, reference numerals 14a, 14c, and 15 again respectively indicate the spaced-apart semiconductor lines, metal lines, and selectable diodes as described above.

Also illustrated in FIG. 4 are a plurality of transistors 20 and 21. These transistors lie beneath insulating layer 13 and are a portion of the previously described interconnected transistors 12. Transistors 20 are depletion devices (such as transistors $T_D$) whereas transistors 21 are enhancement devices (such as transistors $T_E$).

Also lying beneath insulating layer 13 as a portion of the interconnected transistors 12 is an X address decoder and a Y address decoder. Each semiconductor line 14a is driven by an inverted output of the X address decoder; and the gate of each of the transistors 21 is driven by a noninverted output of the Y address decoder. One suitable circuit for these decoders is indicated by reference numeral 22 as an example. Its outputs couple to memory 14 through the apertures 16.

To read information from a particular memory cell, the X address decoder generates a low logic level on the semiconductor line 16 which forms that cell; and the Y address decoder simultaneously generates a high logic level on the gate of the transistor 21 connected to the metal line 14c which forms that cell. If a diode is present in that cell, then current will flow through the diode thereby causing a voltage drop across the depletion transistor 20 which connects to that diode, thus forcing the memory output signal OUT 1 low. Conversely, if no diode is present, no current will flow; and thus the memory output signal OUT 1 will be high.

An alternative preferred means for reading information in memory 14 is illustrated in FIG. 5. There, depletion transistors 23 couple to one end of the semiconductor lines 14a; and enhancement transistors 24 couple to the opposite ends of those lines. Also, each of the metal lines is driven by a noninverting output of an X address decoder; and the gate of each of the transistors 24 is driven by a noninverting output of a Y address decoder—one of which is indicated by reference numeral 25 as a example.

To read information from a particular memory cell, a high logic level is generated by the X address decoder on the metal line 14c which forms a portion of that cell; and a high logic level is simultaneously generated by the Y address decoder on the gate of the transistor 24 connected to the semiconductor line which forms a portion of that cell. If a diode exists in that cell, then current flows through that diode and generates a voltage drop across the depletion transistor 23, which in turn forces the memory output signal OUT 1 to a high logic level. Conversely, if no diode exists in the cell, then the ground voltage level to which the depletion transistors 23 are connected becomes the memory output signal.

A multiple output memory may also be constructed in accordance with FIGS. 4 and 5. In a FIG. 4 type version, respective sets of metal lines 14c exist for each output; while a single set of semiconductor lines 14a is shared by all of the outputs. That is, the metal lines 14c which extend across the chip as illustrated in FIG. 1 are partitioned into N groups where N is the number of memory outputs. Each partitioned group of metal lines then has its own separate set of transistors 20 and 21 for addressing cells within those groups in parallel. By comparison, in a FIG. 5 type version, respective sets of semiconductor lines 14a exist for each output; a single set of metal lines 14c is shared by all of the outputs; and each set of semiconductor lines has its own set of transistors 23 and 24.

For those memories having a relatively large number of outputs, care must be taken to insure that the X-decoder is able to supply the total current needed to generate a high voltage at each output. For example, if the memory has thirty outputs OUT 1 through OUT 30; and the Y decoder has ten outputs (M=10), then each X-decoder output could possibly connect to 300 diodes.

In such a case, the drive current of the X-decoder can be reduced by a factor of M by duplicating the selection transistors 21 between the load transistors 20 and the +V source in the FIG. 4 version, and by duplicating the selection transistors 24 between the load transistors 23 and the +V source in the FIG. 5 version. Then, the X-decoder would only need to supply current to one diode for each memory output.

Alternatively, the same result could be achieved with a "push-pull" type of address decoder, wherein only one metal line is driven high and one semiconductor line is simultaneously driven low in each partitioned group that forms a memory output. That is, unselected metal lines would have a low voltage impressed on them; and unselected semiconductor lines would have a high voltage. Then only the one diode that is located at the intersection of the metal line with the high voltage and the semiconductor line with the low voltage could turn-on.

Figure 6:
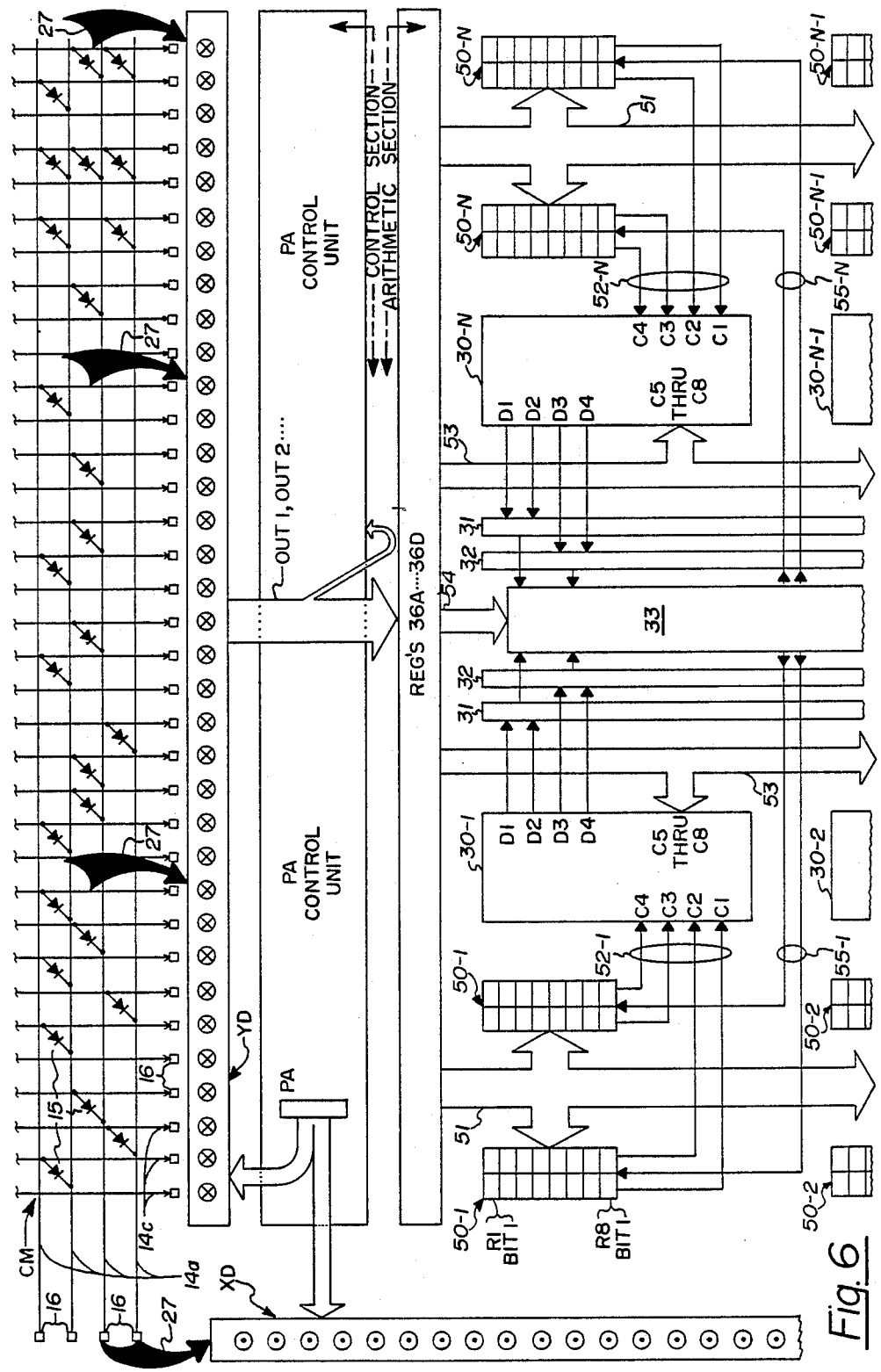
FIG. 6 illustrates a digital computer with a stacked control section that is constructed in accordance with FIGS. 1-5.

Referring now to FIG. 6, a densely packaged digital computer which incorporates the above-described memory will be described. Basically, this computer is an improvement over an invention entitled "Digital Computer Having a Programmable Structure" by Hanan Potash et al, filed Oct. 24, 1979 and assigned Ser. No. 087,666. All of the teachings of that patent application are incorporated herein by reference.

Briefly, the computer of FIG. 6 is divided into an arithmetic section and a control section. One preferred physical layout for the arithmetic section in a semiconductor chip is given in FIG. 8 of the above reference; and that layout, along with the reference numerals, is here reproduced as the bottom portion of FIG. 6. In addition here however, a preferred physical layout for the control section is also illustrated as the top portion of FIG. 6.

That control section includes a control memory CM, an X address decoder XD, and a Y address decoder YD. Memory CM and decoders XD and YD are fabricated as described above. Thus, decoders XD and YD are fabricated in the semiconductor substrate along with the arithmetic section; while control memory CM is fabricated on an insulating layer which overlies the substrate. Several large arrows 27 in FIG. 6 indicate that in the actual physical computer, control memory CM is flipped over to cover everything below decoder YD.

Outputs from decoder XD which carry signals to select a particular memory cell come out of the plane of FIG. 6; and thus they are indicated as a circle with an internal dot. Conversely, inputs to decoder YD come from control memory CM into the plane of FIG. 6, and thus they are indicated as a circle with an internal X. These inputs and outputs of the decoders couple to memory CM through the apertures 16.

Also included in the control portion of the FIG. 6 computer is a present address register PA. This register holds the address which is sent to the above-described decoders XD and YD. Various control logic, such as that described in the above reference, may be utilized to generate the address in register PA; and the physical space occupied by this control logic is indicated in FIG. 6.

Output signals OUT 1, OUT 2, ... from the addressed cells in the control memory are sent through decoder YD to several control memory registers 36a–36d. The actual number of output signals may vary in any particular design, depending upon how the information in control memory CM is encoded. In one preferred embodiment, a total of 32 output signals exists. Thus, decoder YD is portioned into 32 portions, each of which is as illustrated in FIGS. 4 and 5.

One significant feature of the above-described computer architecture is its high packing density. By overlying the arithmetic section, the PA control logic, and decoders XD and YD with control memory CM, the number of cells in control memory CM is substantially increased over that which is feasible when control memory CM is fabricated in the semiconductor substrate.

In one preferred embodiment for example, substrate 10 is 310 mils by 310 mils. Also in this embodiment, semiconductor lines 14a are 4 um wide; their spacing is 2 um; metal lines 14c are 2½ um wide; and their spacing is 2½ um. Thus, the total number of cells in this control memory exceeds 1,000,000; and the total number of 32-bit wide control words exceeds 30,000. By comparison, a full two page ad by Texas Instruments in the Sept. 8, 1980 *Electronic News* describes their single chip TMS9940 computer as having "evolutionary computing power"; but the TMS9940 contains only 2048 control words which are each only 16 bits wide.

Another important feature of the disclosed computer is that since control memory CM is the topmost physical structure, its programming occurs late in the fabrication process. Thus, the FIG. 6 computer can be processed up to the stage where the plurality of spaced apart metal lines 14c are to be formed; and at that point, it can be stockpiled. Then at some later date, the stockpiled device can be programmed to meet the particular needs of a customer.

This programming is carried out by simply fabricating the metal lines 14c and tailoring their contacts to the underlying semiconductor lines 14a. Clearly, this ability to program late in the fabrication process significantly reduces the lead time which is required to fill a customer's order.

Still another feature of the above-described computer is the high speed at which information may be read from control memory CM. In part, this speed is due to the very small parasitic capacitance which exists between the control memory and the underlying active devices.

This small capacitance is due to the presence of the previously described thick insulating layer 13. Typically, the capacitance between memory CM and the underlying active devices is only $4 \times 10^3$ pf/cm$^2$. By comparison, if memory CM were formed in a semiconductor substrate, the typical capacitance between each diode in that memory and the substrate would by $70 \times 10^3$ pf/cm$^2$.

In addition, the high speed with which information can be read from control memory CM is due to the low resistivity (15 ohms per square) of the spaced-apart semiconductor lines, 14a which results when they are fabricated as described above. This low resistivity is due to the high concentration of dopant impurity atoms in the N+ layer (greater than $10^{20}$ atoms/cm$^3$).

By comparison, N+ layer which is formed beneath an $N^{31}$ layer in a substrate typically has a resistivity of greater than 100 ohms per square. This high resistivity is in part due to the fact that the concentration of the N+ layer in a semiconductor substrate must be limited; otherwise parasitic diode that is formed between the N+ layer the substrate becomes leaky. This is not a problem in the present invention because here, the N+ layer forms no P-N with any substrate.

Also, when an N+ region is formed under an N− region in a semiconductor substrate, that N+ region can only be formed by high energy ion implantation. With that technique, dopant atoms are implanted through the N− region to the underlying N+ region. However, some portion of the implanted atoms always stops in the N− region, which raises the doping concentration there.

But the doping concentration in the N− region must stay below approximately $4 \times 10^{17}$ atoms/cm$^3$; otherwise, any contact that it makes with a metal layer will be ohmic. It follows therefore that the doping concentration which forms the N+ region must also be limited; and this in turn raises its resistivity.

Another important feature of the above-described invention is that since memory 14 is formed on an insulating layer above the substrate, the diodes in that memory are not subject to failure due to faults in the underlying substrate lattice. Ideally, a semiconductor substrate is single crystalline; but as a practical matter, crystal defects do occur in commercially available substrates. And if a diode is formed in a substrate where these faults occur, that diode will leak under a reverse bias.

Also, the diodes 15 are highly insensitive to crystalline defects in the spaced-apart semiconductor lines 14a. Thus, the previously described typical electrical characteristics of the diodes 15 occur even though the semiconductor lines 14a are polycrystalline. P-N junction diodes by comparison, are so leaky that they are inoperable when formed in a polycrystalline material.

Still another important feature of the invention relates to the interconnecting of the array 14 to the underlying address decoders XD and YD. As illustrated in FIGS. 1 and 6, the apertures 16 through which these interconnections occur preferably are located only at the perimeter of substrate 10, and only in a regular sequence. This is important because it means that nearly all of the interconnected transistors 12 (i.e. all of them at the chip's interior) can be formed with minimal dimensions and without regard to the overlying diode array; while only a very small fraction of the interconnected transistors 12 (i.e. those at the chip's perimeter) might possibly need to be enlarged to avoid any misalignment problems with the apertures 16.

Figure 7:
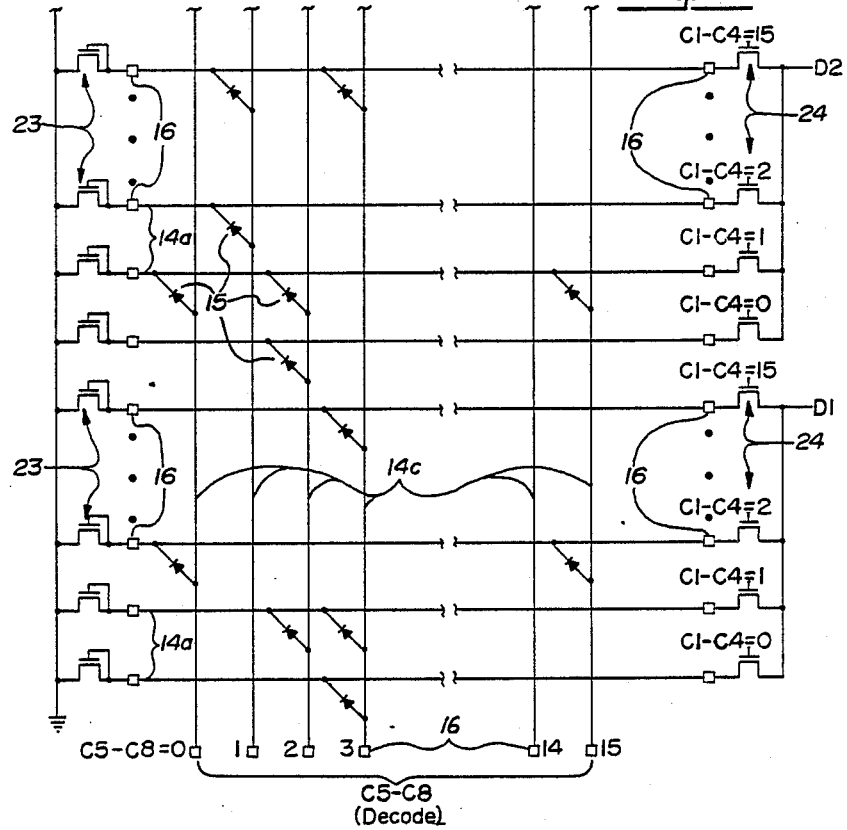
FIG. 7 is a detailed circuit diagram of an arithmetic section of a digital computer which is constructed in accordance with FIGS. 1-3.
Figure 8:
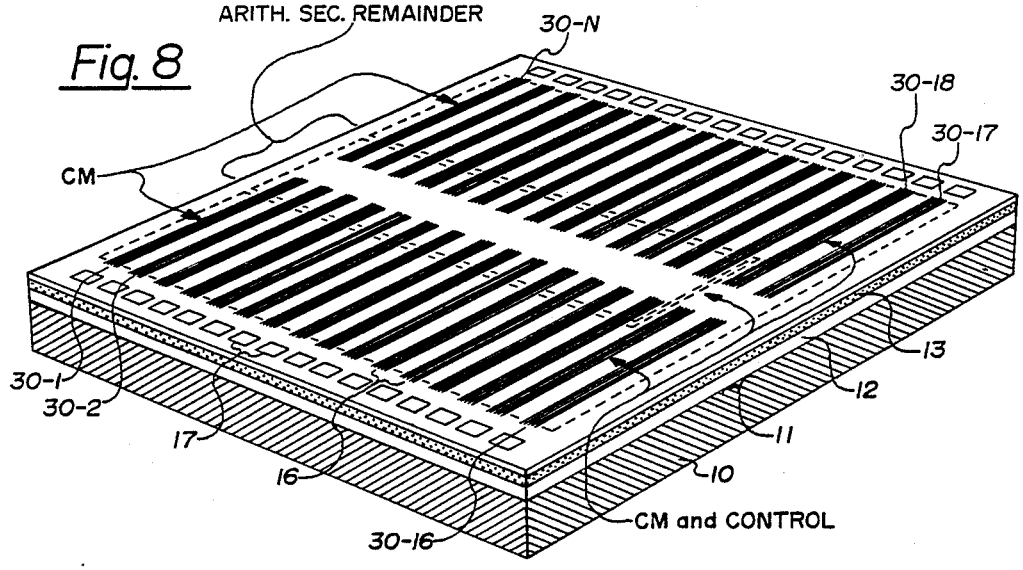
FIG. 8 is a pictorial view of a digital computer having a stacked arithmetic section which is constructed in accordance with FIG. 7.

Turning next to FIGS. 7 and 8, the details of another embodiment of the invention will be described. Basically, in this embodiment, a substantial portion of the arithmetic section of the FIG. 6 computer is formed by several read-only memories which lie on insulating layer 13 above semiconductor substrate 10; while the remaining portion of the computer, including control memory CM, lies in substrate 10.

That portion of the arithmetic section which is formed on insulating layer 13 is the plurality of memories 30-1 through 30-N. As described in the above-referenced copending application Ser. No. 087,666, each of these memories has first address inputs C1-C4, second address inputs C5-C8, and four outputs D1-D4. Inputs C1-C4 receive four data bits of like power from four different registers; inputs C5-C8 simultaneously receive control signals specifying transformations to be performed on the data bits; and in response, output signals D1-D4 are generated to represent the transformed data bits.

A preferred embodiment of one of the memories 30-1 through 30-N is illustrated in FIG. 7. This memory is similar to that described above in conjunction with FIGS. 1 through 5; and in particular, reference numerals 14a, 14c, and 15 again respectively indicate pluralities of spaced-apart semiconductor lines, metal lines, and diodes formed by contacts between those lines. But the selectable diodes 15 in these memories represent transformations of the data bits that are applied to address inputs C1-C4.

The number of semiconductor lines 14a in each of the memories 30-1 through 30-N is equal to the number of different combinations of input signals on the first address inputs C1-C4 times the number of outputs D1-D4. Also, the number of metal lines in each of the memories 30-1 through 30-N is equal to the number of different combinations of input signals on the second address inputs C5-C8. All of these lines are arranged as illustrated in FIG. 7.

In operation, decoded first address input signals are respectively applied to the gates of the transistors 26. Similarly, decoded second address signals are respectively applied to the metal lines 14c. Thus, each control code that is received on the second address inputs C5-C8 generates a high logic level on a particular one of the metal lines 14c. And a diode 15 selectively connects between that one metal line and a semiconductor line depending upon whether the transformation of the first address bits which select that metal line is a 1 or a 0.

A pictorial view of how the FIG. 7 memories preferably are disposed over insulating layer 13 is illustrated in FIG. 8. The number of memories which are there disposed is equal to the number of bits in the data words that are operated on by the arithmetic section of the computer. In the illustrated preferred embodiment, there are 32 bits per data word; and thus, 32 of the FIG. 7 memories are required. Memory 30-1, for example, is one of the FIG. 7 memories.

Also in FIG. 8, that portion of the semiconductor substrate which is occupied by the remainder of the arithmetic section is labeled and enclosed by a dashed line. Registers 50-1 through 50-N, adders 31 and 32, and shifter 33 are included in this section. All of the remaining portion of the semiconductor substrate is then available for implementing control memory CM in its accompanying control logic.

Figure 9:
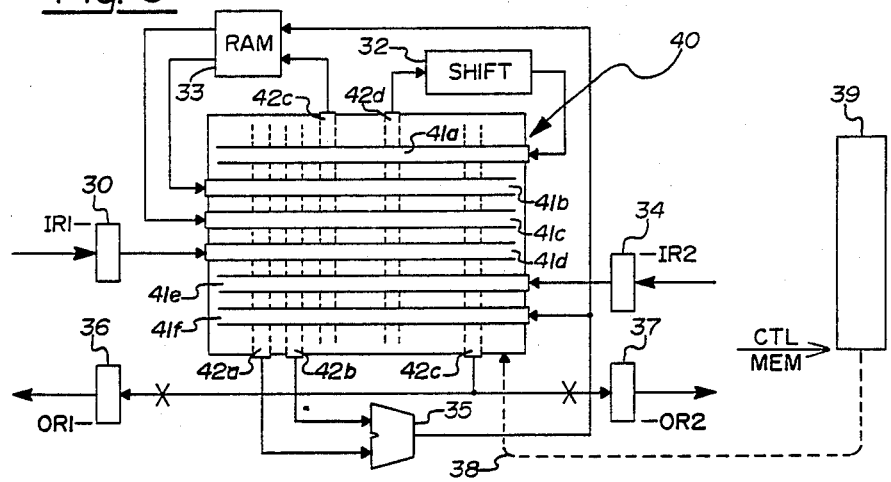
FIG. 9 illustrates a digital computer having a stacked programmable interconnect matrix which is constructed in accordance with FIGS. 1-3.
Figure 10:
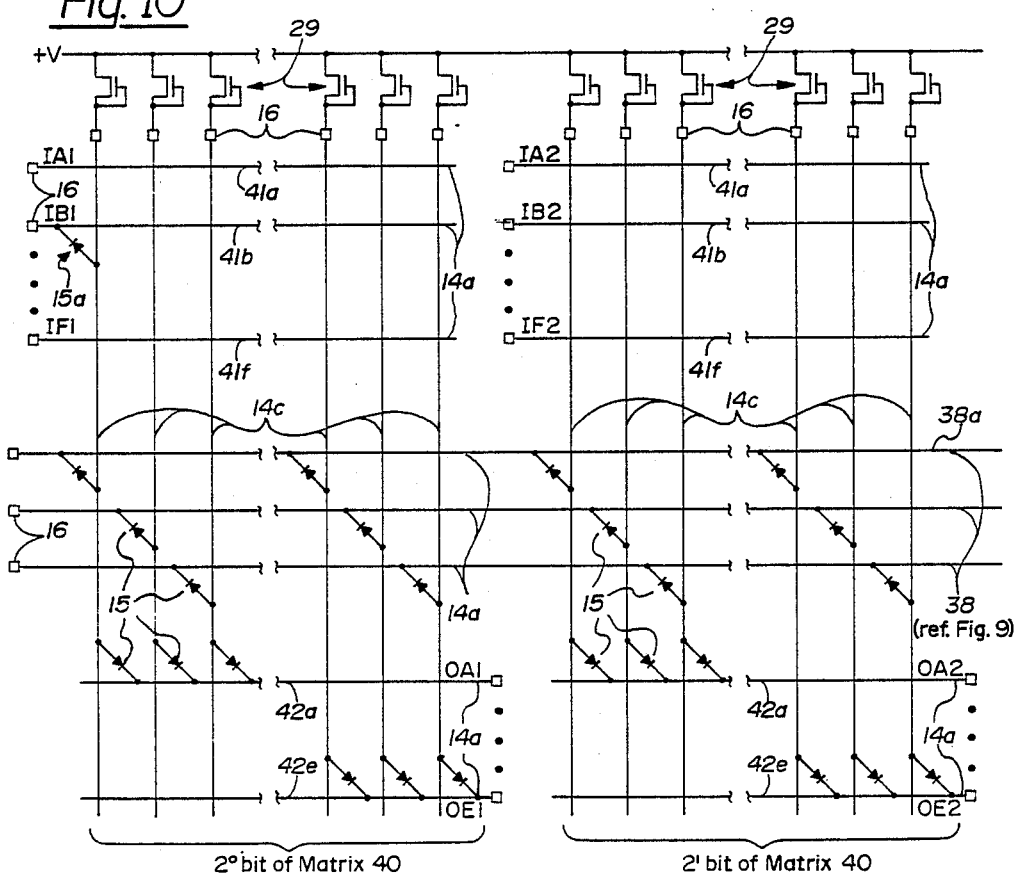
FIG. 10 is a detailed circuit diagram of a preferred embodiment for the stacked interconnect matrix of FIG. 9.

With reference now to FIGS. 9 and 10, still another embodiment of the invention will be described. Basically, this embodiment is an improvement on a digital computer described in a copending patent application entitled "Digital Device Having Programmable Interconnect Matrix" by Hanan Potash et al, filed June 23, 1980 and assigned Ser. No. 162,057. All of the teachings of this application are herein incorporated by reference.

FIG. 3 of that reference, along with the accompanying reference numerals, is reproduced here as FIG. 9. In that Figure, reference numeral 40 indicates a programmable interconnect matrix. And in the present invention matrix 40 is fabricated on insulating layer 13 above semiconductor substrate 10; while all of the remaining components in FIG. 9 are fabricated beneath insulating layer 13 in substrate 10.

Preferably, interconnect matrix 40 is constructed on insulating layer 13 as illustrated in FIG. 10. In that Figure, reference numerals 14a, 14c, and 15 again respectively indicate pluralities of spaced-apart semiconductor lines, metal lines, and Schottky diodes between the semiconductor and metal lines. Components 14a, 14c, and 15 are formed as was previously described in conjunction with FIGS. 2 and 3.

FIG. 10 is symmetrically divided into two halves. The left half of FIG. 10 illustrates that portion of matrix 40 which interconnects bits of the $2^0$ power; while the right half of FIG. 10 illustrates that portion of matrix 40 which interconnects bits of the $2^1$ power. In a 32 bit computer, the left half portion of FIG. 10 (or equivalently the right half portion) is repeated 32 times.

Signals IA1, IA2, IA2 . . . IE1 respectively indicate signals of the $2^0$ power on input buses 41a, 41b, . . . 41f. Similarly, signals IA2, IB2 . . . IF2 represent signals of the $2^1$ power on those input buses. Also, signals OA1 . . . OE1 represent signals of the $2^0$ power on output buses 41a . . . 41e; and signals OA2 . . . OE2 represent signals of the $2^1$ power on those output buses.

In operation, signals on the input buses are selectively transferred to the output buses in response to control signals on control lines 38. One control line exists for each selectable transfer; and in FIG. 10, three control lines are illustrated as an example.

Diodes 15 are symmetrically disposed between the control lines 38 and semiconductor lines 14c. That is, these diodes are not selectably placed; but instead, they are always placed as illustrated. Similarly, the diodes 15 between output lines 42a–42e and metal lines 14c are not selectably placed; but instead, they also are always placed as illustrated.

By comparison, the location of the diodes 15 between the semiconductor lines which form input buses 41a–41f and the metal lines 14c is selectable. Also, only one diode can be placed between any one particular metal line 14c and the input buses 41a–41f. In other words, each metal line 14c interconnects one input bus line, one control line, and one output line through respective diodes. And signals on that one input bus line are transferred to the one output line in response to a high logic signal on the one control line.

When low logic levels are generated on all of the control lines 38, the voltage level on all of the metal lines 14c will be low. Thus, a logical low will also be generated on output lines 42a-42e. But when a high logic level is generated on one control line, such as line 38a, the diodes 15 which are connected to that control line turn off. Thus, the metal lines 14c which connect to those turned off diodes are able to charge to a high logic level. This charging either will or will not occur depending upon the signal or the input bus which connects to that metal line through a selectable diode.

Suppose for example that selectable diode 15a is placed as illustrated. Then, if input signal IB1 is low, output signal OA1 will also be low because the metal line 14c which connects to diode 15a will be pulled low through that diode. Conversely, if input signal IB1 is high, then diode 15a will be turned off; metal line 14c connected to diode 15a will charge through a depletion transistor 29; and output signal OA1 will go high.

Thus in this embodiment of the invention, the matrix of diodes on top of insulating layer 13 are not interconnected as a memory; but instead, they are interconnected to form a plurality of AND-OR gates. Each gate is comprised of one metal line 14c and three diodes 15 which connect to it. One of those three diodes connects to one of the output lines 42a-42e, and it performs the OR function; while the other two diodes connect to one control line and one input line, and they perform the AND function.

Figure 11:
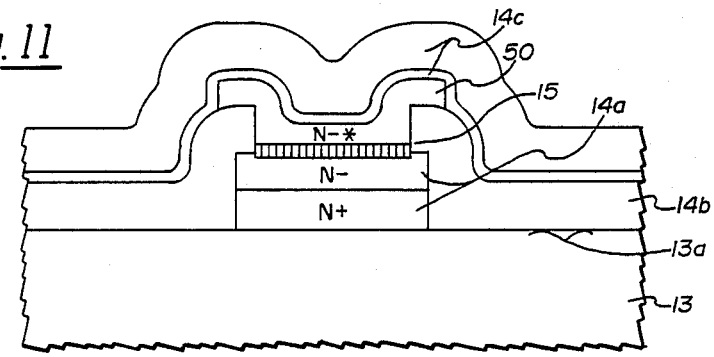
FIG. 11 is a greatly enlarged cross-sectional view of another embodiment of the invention.

Referring now to FIG. 11, still another embodiment of the invention will be described. This embodiment is somewhat similar in structure to the embodiment of FIGS. 1, 2, and 3; and like components are indicated by like reference numerals.

In particular, the FIG. 11 embodiment covers a read-only memory that is fabricated on an insulating layer 13 which overlies a semiconductor substrate on which a plurality of interconnected field effect transistors are fabricated, such as was previously described in conjunction with FIGS. 1 and 2. However, each memory cell in the FIG. 11 embodiment is electrically programmable; whereas each cell in the previously described embodiments of FIGS. 1-3 is mask programmable.

That is, information is written into the memory cell of FIGS. 1-3 during the fabrication process by selectively forming or not forming the Schottky diode 15 in the memory cell. But by comparison, in the FIG. 11 embodiment, a Schottky diode 15 is always formed in every memory cell during the fabrication process. And information in the FIG. 11 memory cell is represented by the resistive state of a material 50 whose resistance is electrically alterable after the fabrication process is complete. Material 50 lies between leads 14a and 14c, and is in series with Schottky diode 15.

Preferably, the material 50 consists essentially of a single element semiconductor selected from the group of Si, Ge, C, and α-Sn. Also preferably, material 50 has a doping concentration of less than $10^{17}$ dopant atoms/cm$^3$, a smaller crystalline grain size than that of lead 14a, and during fabrication is never subjected to processing temperatures above 600° C. Arsenic and phosphorous are suitable N-type dopants.

With these constraints imposed on material 50, either alone or in combination, that material exhibits a relatively high resistance so long as the voltage across it (as supplied by leads 14a and 14c) does not exceed a threshold level. As an example, that threshold level in one preferred embodiment of the material is 10 volts. Then, when the threshold voltage across material 50 is exceeded, it irreversibly switches from its relatively high resistance state to a relatively low resistance state.

Figure 12:
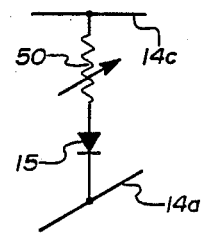
FIG. 12 is an equivalent circuit diagram of the embodiment in FIG. 11.
Figure 13:
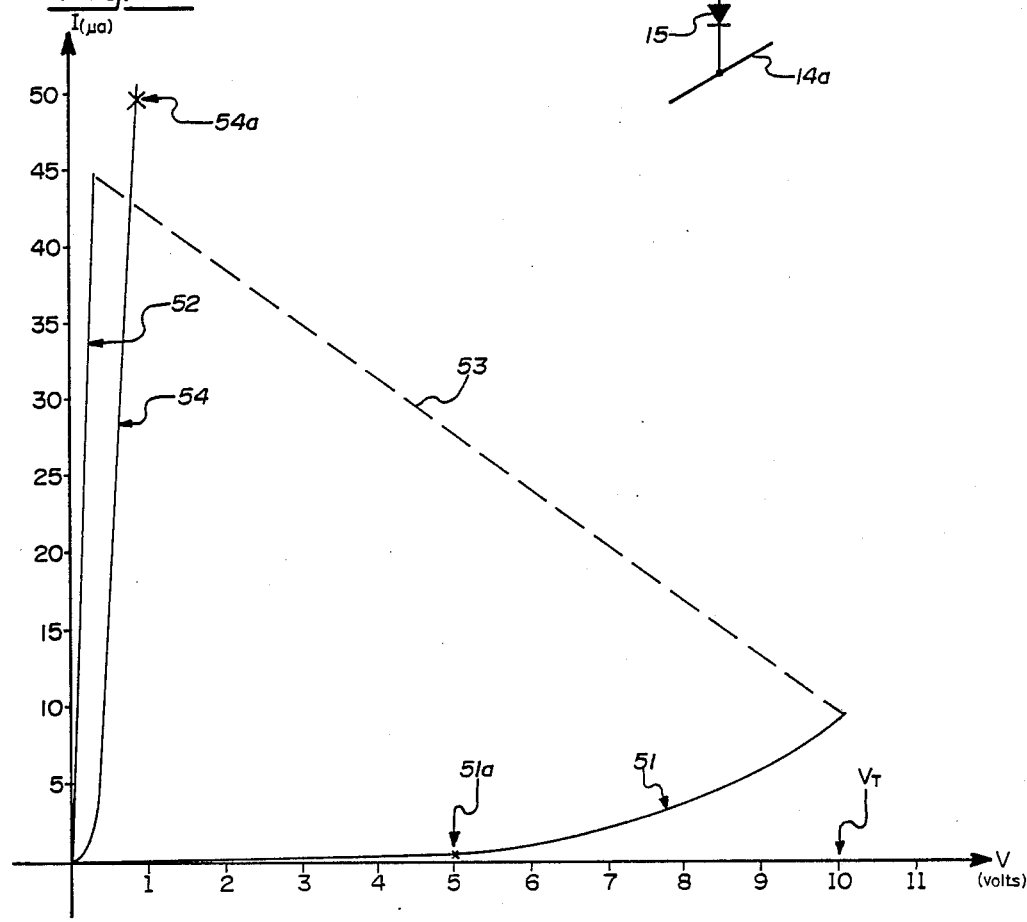
FIG. 13 is a set of curves illustrating the operation of the FIG. 11 embodiment.

Thus an equivalent circuit for the FIG. 11 embodiment is as illustrated in FIG. 12; and the operation of that embodiment is as illustrated in FIG. 13. In FIG. 12, a pair of spaced-apart leads for receiving a voltage to be applied across the memory cell are provided by components 14a and 14c; a Schottky diode for isolating the memory cell from other memory cells which are also connected to leads 14a and 14c is provided by component 15; and the information-containing element in the memory cell is provided by the electrically alterable resistance material 50. Typically, the resistance through material 50 is on the order of $10^7$ or $10^2$ ohms depending upon whether the threshold voltage across that material has ever been exceeded.

In FIG. 13, curve 51 illustrates the I-V characteristics of material 50 when its threshold voltage has not been exceeded. This curve is also essentially the same as the I-V curve for the series combination of material 50 and Schottky diode 15. Also in FIG. 13, curve 52 gives the I-V characteristics of material 50 after the threshold voltage across that material has been exceeded. A dashed line 53 shows how the characteristics of material 50 irreversibly switches from curve 51 to 52. This switching occurs rapidly, and is complete within several microseconds. Finally, in FIG. 13, curve 54 gives the I-V characteristics of the series combination of material 50 in its low resistance state and diode 15.

During a normal read operation of the FIG. 11 memory cell, the voltage across leads 14a and 14c is limited to always be less than the threshold voltage, and the current through the memory cell is also limited to always be less than some preselected value. Thus if material 50 is in a high resistance state and voltage across leads 14a and 14c is limited to 5 volts, then the memory cell will operate at point 51a or curve 51. Alternatively, if material 50 is in a low resistance state and the current through the cell is limited to 50 microamps, then the cell will operate at point 54a on curve 54.

At point 51a, the current through and voltage across the memory cell respectively are 0.2 microamps and 5 volts; and at point 54a, the current through and voltage across the memory cell respectively are 50 microamps and 0.25 volts. These different voltages and currents are sensed on lines 14a and 14c as information stored in the cell.

One preferred method for constructing the memory cell of FIG. 11 is as follows: Initially, a 4000 Å thick N+ layer of semiconductor material is deposited on surface 13a. Dopant atoms in this N+ layer have a concentration of at least $10^{20}$ atoms/cm'. Thereafter, a 4000 Å thick layer of N− semiconductor material is deposited on the N+ layer. Dopant atoms in this N− layer have a concentration of $10^{14}$–$10^{17}$ atoms/cm$^3$. Thereafter, the N− and N+ layers are masked and etched to form lead 14a.

Subsequently, a silicon dioxide layer is formed over surface 13a and lead 14a. This silicon dioxide layer is then masked and etched to form insulator 14b having a contact hole over semiconductor 14a as illustrated in FIG. 11. Thereafter, the resulting structure is annealed at 900° C. This annealing step increases the crystalline grain size and "activates" the dopant impurity atoms in lead 14a. By "activate" is herein meant it causes the dopant atoms to move from interstitial to substitutional positions in the lattice.

Thereafter, a 250 Å thick layer of platinum is formed over insulator 14b and the exposed portion of lead 14a. This platinum layer is heated to 450° C. to form a compound (e.g. platinum silicide) with the exposed portion of lead 14a. This compound is indicated by the vertical crosshatch lines in FIG. 11; and it is the junction between this compound and the underlying N⁻ layer which form Schottky diode 15.

Thereafter, that portion of the platinum on insulating layer 14b which does not form a compound is removed. And an N⁻ layer of 2000 Å thickness is deposited over insulator 14b and diode 15. This N⁻ layer contains dopant impurity atoms of less than $10^{17}$ atoms/cm$^3$. For example, it can be completely undoped. Thereafter, this N⁻ layer is masked and etched to form the variable resistor 50.

Preferably, throughout the fabrication process, the temperatures to which the material 50 is exposed are less than 600° C. This constraint has the effect of insuring that the crystalline grain size in material 50 is substantially smaller than the crystalline grain size in the N⁻ layer of lead 14a, and of insuring that any dopant atoms in material 50 are interstitial in the lattice as opposed to being substitutional. These physical features distinguish material 50 from the N⁻ layer in lead 14a, and they are indicated in FIG. 11 by an asterisk.

Following the masking and etching of material 50, a 1000 Å thick layer of titanium tungsten is formed on insulator 14b and material 50; and an 8000 Å thick layer of aluminum is formed on the titanium tungsten layer. Titanium tungsten is included to provide a barrier to the aluminum; that is, it prevents the aluminum from migrating into the material 50. These two layers are then masked and etched to form lead 14c.

By following the steps of the above method, the resulting embodiment will have the I-V characteristics of FIG. 13. But if it is desired to somewhat alter those characteristics, then some of the details of the above steps may be modified accordingly. For example, the threshold voltage $V_t$ can be lowered by decreasing the thickness of layer 50. Also, the current corresponding to $V_t$ increases as the maximum temperature to which material 50 is subjected increases.

This dependence of $V_t$ on processing temperature is highly nonlinear. And, as an example, a sample of material 50 that is processed to a maximum temperature of 600° C. might require only 10 microamps to switch resistive states; whereas that same sample processed to a maximum temperature of 750° C. might require several milliamps to change resistance states.

Turning now to FIGS. 14 and 15, there is illustrated detailed circuit diagrams of memory arrays of the FIG. 11 memory cell. These memory arrays are similar to those previously described in conjunction with FIGS. 4 and 5; and like components are indicated by like reference numerals.

One primary different between the memory arrays of FIGS. 14 and 15, and the memory arrays of FIGS. 4 and 5, is that in the former an electrically alterable resistance 50 and Schottky diode 15 is provided at each and every intersection of leads 14a and 14c. In FIGS. 14 and 15, the electrically alterable resistor 50 is indicated as an "x" for simplicity.

Also in FIGS. 14 and 15, programming means are provided for selectively applying a programming voltage $V_p$ across the memory cells. Voltage $V_p$ is a voltage that is somewhat greater than the threshold voltage $V_t$.

Considering first FIG. 14, this programming means includes transistors 60, 61, and 62 which are interconnected to the memory array as illustrated. Control signals are applied to these transistors via a pair of external pins 63.

During a normal read operation, an externally supplied Program signal (PROG) is false; and thus transistor 62 is turned on while transistors 60 and 61 are turned off. Under this condition, the memory array of FIG. 14 behaves exactly as was previously described in conjunction with FIG. 4.

Conversely, when signal PROG is true, transistor 62 is turned off while transistors 60 and 61 are turned on. Under this condition, programming voltage $V_p$ is applied to the lead carrying signal OUT 1; and from there, voltage $V_p$ is selectively applied across the memory cells by means of the X and Y select signals. For example, to apply voltage $V_p$ across the memory cell indicated by reference numerals 64, signals X=1 and Y=2 are both forced true by means of the address signals $2^0$, $2^1$, . . . , etc.

Similarly, in the FIG. 15 memory array, transistors 70, 71, 72, and 73 are provided as a means for selectively programming the memory cells; and control signals are applied to these transistors via external pins 74. When signal PROG is false, transistors 71 and 73 are turned off and transistors 70 and 72 are turned on. Under that condition, the memory array of FIG. 15 behaves exactly as the previously described memory array of FIG. 5.

Conversely, when signal PROG is true, transistors 71 and 73 are turned on, while transistors 70 and 72 are turned off. Under that condition, voltage $V_p$ is selectively applied to one of the X lines through decoder 24; and from there, voltage $V_p$ is applied across one of the memory cells connected to that X line by turning on one of the transistors 24. For example, to apply voltage $V_p$ across the memory cell indicated by reference numerals 75, signals X=0 and Y=0 are both made true by appropriately selecting the address signals $2^0$, $2^1$, . . . , etc.

Both of the memory arrays in FIGS. 14 and 15 may also be expanded to have multiple outputs as was previously described in conjunction with FIGS. 4 and 5. And those multiple output memories may then be configured in accordance with the invention as a control memory within the control section of a digital computer as was described above in conjunction with FIG. 6, as an arithmetic section for a digital computer as was described above in conjunction with FIGS. 7 and 8, and as an interconnect matrix for a digital computer as was described above in conjunction with FIGS. 9 and 10.

These embodiments of the invention have all of the features and advantages that were previously pointed out in conjunction with description of FIGS. 6–10. But in addition, they have the attractive feature of being electrically programmable—which occurs after the fabrication process is entirely complete. Thus, each cell of the control memory of FIG. 6 and the arithmetic section of FIGS. 7 and 8 is initially fabricated as illustrated in FIG. 12; and thereafter the resistance of material 50 is selectively altered in the individual cells. Similarly, each crossing of the input buses IA1 ... IF1, IA2 ... IF2, etc., and lines 14c in the select matrix of FIG. 10 is initially fabricated as illustrated in FIG. 12; and thereafter the resistance of material 50 at the crossings is selectively altered.

Turning now to FIGS. 16 and 17, two other additional embodiments of the invention will be described. Both of these embodiments are similar to the above-described FIG. 11 embodiment in that they comprise electrically programmable read-only memory cells and they both have I-V characteristics similar to those illustrated in FIG. 13.

As illustrated in FIG. 16, that embodiment includes a patterned N+ layer 14a' which forms one lead to the memory cell similar to the previously described lead 14a. Suitably, lead 14a' is 4000 Å thick. Then lying on lead 14a'. is a 500 Å thick layer of platinum silicide 80; and lying on it is a 4000 Å thick layer of N− semiconductor material 81. Layer 81 has a doping concentration of $10^{14}$–$10^{17}$ atoms/cm$^3$ and is annealed at 800° C. to form a Schottky diode 15 at the junction between it and layer 80.

Then lying on layer 81 is a layer of the previously described electrically alterable resistive material 50. This material is indicated in FIG. 16 as an N− region followed by an asterisk, which indicates that it is subject to the same processing constraints as was material 50 in the FIG. 11 embodiment. Accordingly, material 50 in FIG. 16 has the I-V characteristics of FIG. 13.

To complete the structure, the second lead 14c to the memory cell is fabricated. It includes a layer of titanium tungsten in contact with material 50, and a layer of aluminum lying on top of the titanium tungsten. This completed structure has an equivalent circuit similar to the previously described FIG. 12 with the exception being that the direction of diode 15 is reversed. That is, conduction through diode 15 occurs when the electric potential on lead 14a' is positive with respect to the electric potential on lead 14c.

Considering now the FIG. 17 embodiment, it includes layers 14a', 80, and 81 as does the FIG. 16 embodiment. But lying on layer 81 in the FIG. 17 embodiment is a 2000 Å thick layer of N−* material 50; and lying thereon is a second 500 Å thick layer of platinum silicide 82. Then to complete the structure, lead 14c is fabricated in contact with layer 82.

With this structure, each memory cell includes a pair of back-to-back Schottky diodes 15 and 15'. Diode 15 is formed at the junction between layers 80 and 81; whereas diode 15' is formed at the junction between layers 50 and 82. And the cell's high resistance state is supplied by the reverse bias resistance of diode 15' in series with the resistance of material 50.

This memory cell is programmed by applying a voltage across leads 14a' and 14c which exceeds the threshold voltage of material 50 in the reverse bias direction of Schottky diode 15'. This voltage, in addition to greatly lowering the resistance of material 50 as described above, also greatly reduces the reverse bias resistance of diode 15'. Thus, the low resistance state of the cell is essentially reduced to the forward resistance of diode 15. Consequently, the I-V characteristics are as illustrated in FIG. 13.

Both the FIG. 16 memory cell and the FIG. 17 memory cell can be incorporated, in accordance with the invention, into the memory arrays of FIGS. 14 and 15. And those memory arrays can further be incorporated, in accordance with the invention, into a digital computer as a control memory, an arithmetic section, or an interconnect matrix as was described above in conjunction with FIGS. 6–10. All of these various combinations are deemed to be different embodiments of the present invention.

Several preferred embodiments of the invention have now been described in detail. In addition, however, many modifications and changes may be made to these details without departing from the nature and spirit of the invention. For example, the N-type semiconductor layers in the above described embodiments can be replaced with P-type semiconductor layers. These include layers 14a, 14', and 50. Accordingly, it is to be understood that the invention is not limited to said details but is defined by the appended claims.

What is claimed is:

1. A vertically stacked electrically programmable digital computer comprised of:
   a first storage means in a semiconductor substrate for storing data signals, and a second storage means in said substrate for storing control signals;
   an insulating layer on top of said first and second storage means and said substrate;
   a memory means on top of said insulating layer containing a plurality of addressable memory cells, each cell including a resistive means that irreversibly switches from a high resistance state to a low resistance state upon the passage of a current through the cell in excess of a certain threshold level;
   said resistive means consisting essentially of a nonferrous, nonmetallic single element semiconductor material having a small grain size relative to that of polycrystalline silicon which has been heated above 600° C.;
   said memory means further including an addressing means coupled through said insulating layer to said first and second storage means for simultaneously receiving said data signals and control signals as an address for said cells;
   said data signals in said address representing operands, said control signals in said address representing an operation, and said resistance states of said cells at said address being programmed to represent the result of said operation on said operands.

2. A computer according to claim 1 wherein said resistive means contains less than $10^{17}$ dopant atoms/cm$^3$ for said single element semiconductor material.

3. A computer according to claim 2 wherein said single element semiconductor material is selected from the group consisting of Si, Ge, C, and α-Sn.

4. A computer according to claim 3 wherein each of said memory cells further includes a diode on said insulating layer in series with said resistive means.

5. A computer according to claim 4 wherein said cells of said memory means are disposed on said insulating layer as a plurality of arrays, and wherein said addressing means includes means for addressing a cell in every array simultaneously.

6. A computer according to claim 5 wherein said addressing means includes a plurality of metal lines and a plurality of semiconductor lines which cross each other, and wherein said resistive means of each cell lies between the crossings.

7. A computer according to claim 1 wherein said resistive means consists essentially of a single element semiconductor material as selected from the group consisting of Si, Ge, C, and α-Sn.

8. A computer according to claim 1 wherein each of said memory cells further includes a diode on said insulating layer in series with said resistive means.

9. A computer according to claim 1 wherein said cells of said memory means are disposed on said insulating layer as a plurality of arrays, and wherein said addressing means includes means for addressing a cell in every array simultaneously.

10. A computer according to claim 1 wherein said means for coupling includes a plurality of metal lines and a plurality of semiconductor lines which cross each other, and wherein said resistive means of each cell lies between the crossings.

11. A vertically stacked electrically programmable digital computer comprised of:
- a first storage mans in a semiconductor substrate for storing data signals, and a second storage means in said substrate for storing control signals;
- an insulating layer on top of said first and second storage means and said substrate:
- a memory means on top of said insulating layer containing a plurality of addressable memory cells, with each cell consisting essentially of nonferrous, nonmetallic single element semiconductor material that irreversibly switches from a high resistance state to a low resistance state upon the passage of a threshold current through the cell;
- said memory means further including an addressing means coupled through said insulating layer to said first and second storage means for simultaneously receiving said data signals and control signals as an address for said cells;
- said data signals in said address representing operands, said control signals in said address representing an operation, and said resistance states of said cells at said address being programmed to represent the result of said operation on said operands; and
- said semiconductor material being silicon with crystalline grains of a predetermined small size such that said threshold current for programming said cells is in the microamp range.

* * * * *